(12) United States Patent
Kim et al.

(10) Patent No.: US 6,586,288 B2
(45) Date of Patent: Jul. 1, 2003

(54) METHOD OF FORMING DUAL-METAL GATES IN SEMICONDUCTOR DEVICE

(75) Inventors: Tae Kyun Kim, Kyoungki-do (KR); Tae Ho Cha, Kyoungki-do (KR); Jeong Youb Lee, Seoul (KR); Se Aug Jang, Kyoungki-do (KR)

(73) Assignee: Hynix Semiconductor Inc., Kyoungki-do (KR)

( * ) Notice: Subject to any disclaimer, the term of this patent is extended or adjusted under 35 U.S.C. 154(b) by 25 days.

(21) Appl. No.: 09/982,841

(22) Filed: Oct. 18, 2001

(65) Prior Publication Data

US 2002/0058374 A1 May 16, 2002

(30) Foreign Application Priority Data

Nov. 16, 2000 (KR) .................... 2000-0067946
Nov. 16, 2000 (KR) .................... 2000-0067947

(51) Int. Cl.[7] .......................................... H01L 21/338
(52) U.S. Cl. ............................... 438/183; 438/275
(58) Field of Search ............................ 438/183, 275–8

(56) References Cited

U.S. PATENT DOCUMENTS

| | | | |
|---|---|---|---|
| 5,970,331 A | * 10/1999 | Gardner et al. | ............. 438/199 |
| 6,008,084 A | 12/1999 | Sung | |
| 6,017,813 A | 1/2000 | Kuo | |
| 6,077,733 A | 6/2000 | Chen et al. | |
| 6,368,923 B1 | * 4/2002 | Huang | ........................ 438/275 |
| 6,376,888 B1 | * 4/2002 | Tsunashima et al. | ........ 257/407 |

FOREIGN PATENT DOCUMENTS

JP 012538 1/2000

* cited by examiner

*Primary Examiner*—John F. Niebling
*Assistant Examiner*—Christopher Lattin
(74) *Attorney, Agent, or Firm*—Ladas & Parry

(57) ABSTRACT

A method of forming dual-metal gates in a semiconductor device, including the steps of providing a semiconductor substrate having a PMOS area and an NMOS area wherein dummy gates are formed in the PMOS and NMOS areas respectively, forming an insulating interlayer on the semiconductor substrate so as to cover the dummy gates, polishing the insulating interlayer until the dummy gates are exposed, forming a first groove defining a first metal gate area by selectively removing one of the dummy gates formed in the PMOS and NMOS areas, forming a first gate insulating layer and a first metal layer on an entire area of the semiconductor substrate including the first groove successively, forming a first metal gate in the first groove by etching the first metal layer and first gate insulating layer until the insulating interlayer is exposed, forming a second groove defining a second metal gate area by removing the remaining dummy gate, forming a second gate insulating layer and a second metal layer on the entire area of the semiconductor substrate including the second groove, and forming a second metal gate in the second groove by etching the second metal layer and second gate insulating layer until the insulating interlayer is exposed.

20 Claims, 8 Drawing Sheets

METHOD OF FORMING DUAL-METAL GATES IN SEMICONDUCTOR DEVICE

BACKGROUND OF THE INVENTION

1. Field of the Invention

The present invention relates generally to a method of forming dual-metal gates in a semiconductor device, and more particularly, to a method of forming dual-metal gates in a semiconductor device using a damascene process.

2. Description of the Related Art

Lately, as development of a sub-0.1 μm MOSFET device progresses, a gate having low resistance is the major issue for securing device characteristics. Thus, many efforts are made to develop a metal gate as a substitute for the previous polysilicon or transition metal silicide gate.

Specifically, a gate in a MOSFET device is formed of polysilicon to sufficiently satisfy the gate-requiring physical properties such as high melting point, and to decrease difficulty in film formation and in line pattern, stability for oxidation ambience, surface planarization and the like. Moreover, in an actual MOSFET device, a polysilicon gate containing dopants such as P, As, B or the like realizes the low resistance.

However, gate width, gate insulating layer thickness, junction depth and the like are eventually reduced as the integration of a semiconductor is highly increased. Thus, polysilicon fails to further realize the low resistance required for the critical dimension.

In the mean time, developments for new gate material as a substitute for polysilicon progresses are necessitated. In the early days, the research and developments are focused on a polycide gate using transition metal silicide material. Yet, the polycide gate still contains a polysilicon content resulting in difficulty in realizing low resistance. Namely, the polysilicon content in the polysilicide gate brings about the increasing effective thickness of a gate insulating layer due to gate depletion effect, threshold voltage variance due to boron penetration/dopant distribution fluctuation in a p+ doped polysilicon gate and the like, thereby producing a limitation to realize low resistance therein.

Research and development for the metal gate addressing the above disadvantages is required badly.

Boron penetration and gate depletion do not arise in a metal gate using no dopant. Moreover, the metal gate has a work function value corresponding to a mid-band gap of silicon, thereby being applied to a single gate enabling the formation of symmetric threshold voltage in NMOS and PMOS areas. In this case, W, WN, Ti, TiN, Mo, Ta, TaN and the like are the metals of which work function values correspond to the mid-gap of silicon.

If a CMOS device including the single gate is fabricated using a metal gate, flat band voltage of the device in NMOS and PMOS areas is reduced. Thus, threshold voltage is increased. In order to reduce the threshold voltage, a buried channel should be formed using counter doping. Yet, in such a case, the short channel effect of a MOSFET device is increased, threshold voltage is decreased, DIBL (drain induced barrier lowering) and the like are brought about.

Therefore, the latest research and development is carried out on forming a dual-metal gate in a manner that metal gates having different work function values are formed in the NMOS and PMOS areas respectively using the operation principle of a dual-polysilicon gate.

It is ideal for forming a dual-metal gate that Fermi energy value of a metal gate in NMOS area exists near a conduction band of silicon while that of the other metal gate in PMOS area exists near a valence band of silicon.

A method of forming dual-metal gates in a semiconductor device according to the prior art is explained by referring to FIG. 1A to FIG. 1E as follows.

FIGS. 1A to 1E illustrate cross-sectional views of forming gates in a semiconductor device according to the prior art.

Figure 1A:
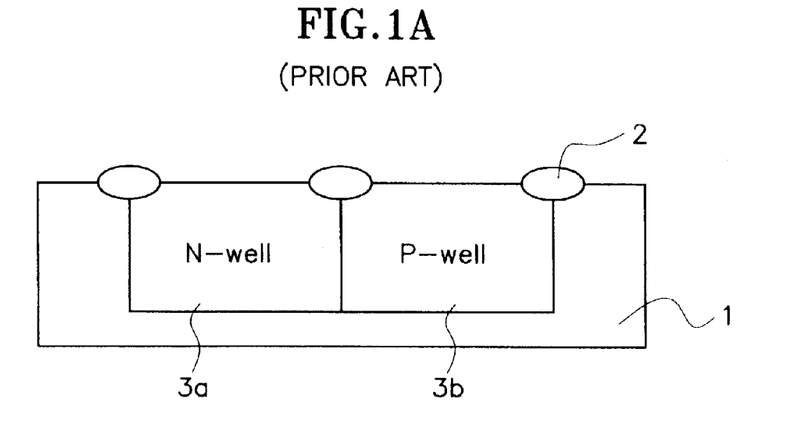
FIGS. 1A to 1E illustrate cross-sectional views of forming gates in a semiconductor device according to the prior art.

Referring to FIG. 1A, a semiconductor substrate 1, having a field oxide layer 2, is provided. An N well 3a and a P well 3b are formed respectively in the semiconductor substrate 1 using masking and ion implantation processes known in the art. A screen oxide layer (not shown in the drawing) of a film is formed on the semiconductor substrate 1. Ion implantations known in the art for adjusting threshold voltage are then carried out on the N well 3a and P well 3b areas respectively.

Figure 1B:
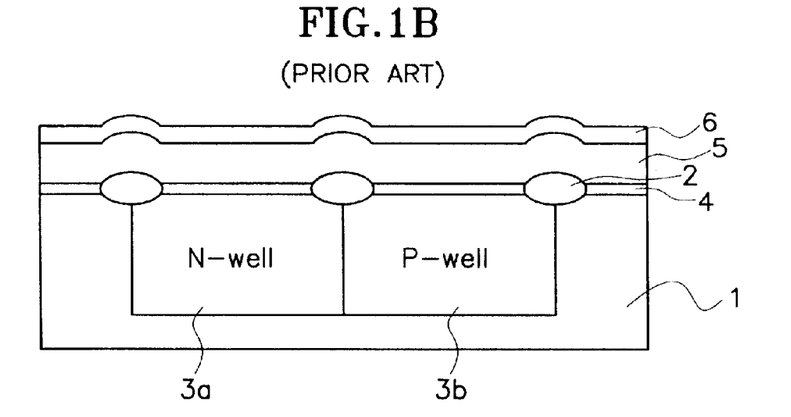

Referring to FIG. 1B, after the screen oxide layer has been removed, a gate insulating layer 4, a PMOS metal layer 5, and a barrier layer 6 are formed on the semiconductor substrate 1 including the field oxide layer 2, sequentially. The PMOS metal layer 5 is formed of a metal material of which the Fermi energy lies near a valence band of silicon.

Figure 1C:
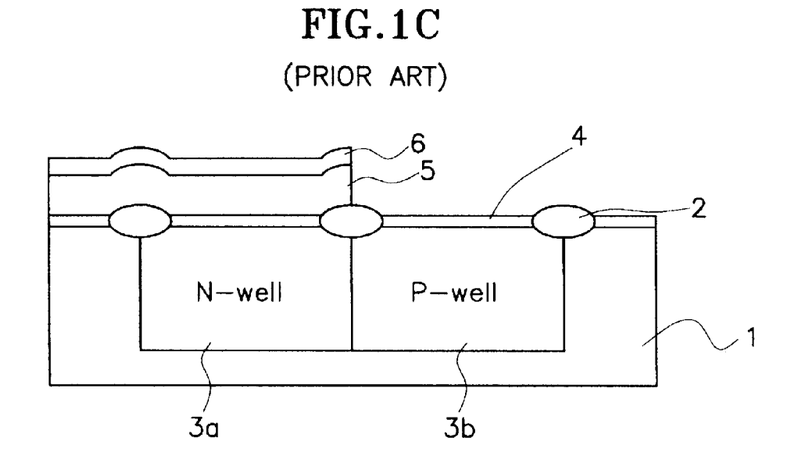

Referring to FIG. 1C, a mask pattern (not shown in the drawing) covering the PMOS area is formed on the barrier layer 6. Then, the barrier layer 6 and PMOS metal layer 5 in the exposed NMOS area are etched.

Figure 1D:
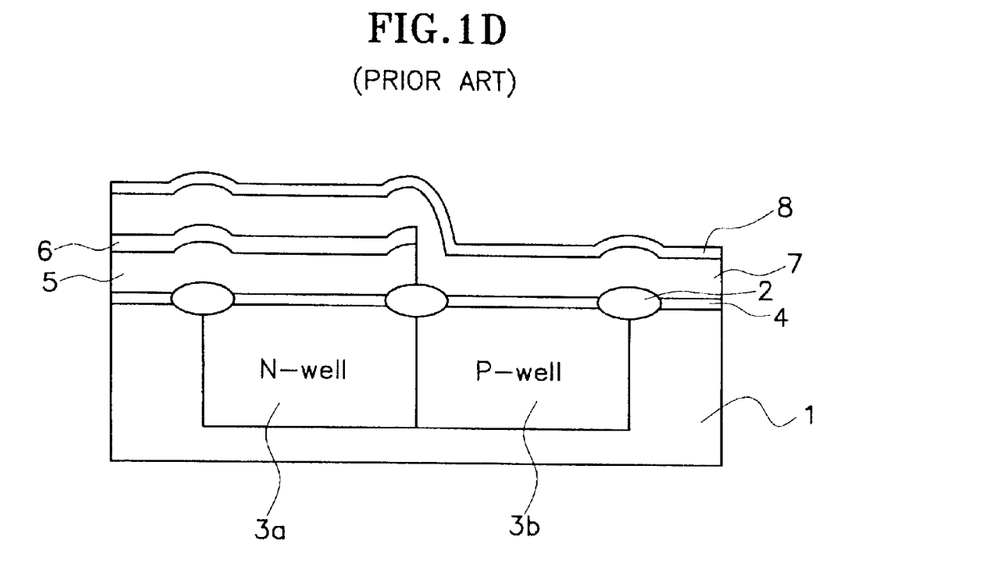

Referring to FIG. 1D, an NMOS metal layer 7 is formed over an entire surface of the semiconductor substrate 1. A mask nitride layer 8 is then formed on the NMOS metal layer 7. In this case, the NMOS metal layer 7 is a metal material of which the Fermi energy lies near a conduction band of silicon.

Figure 1E:
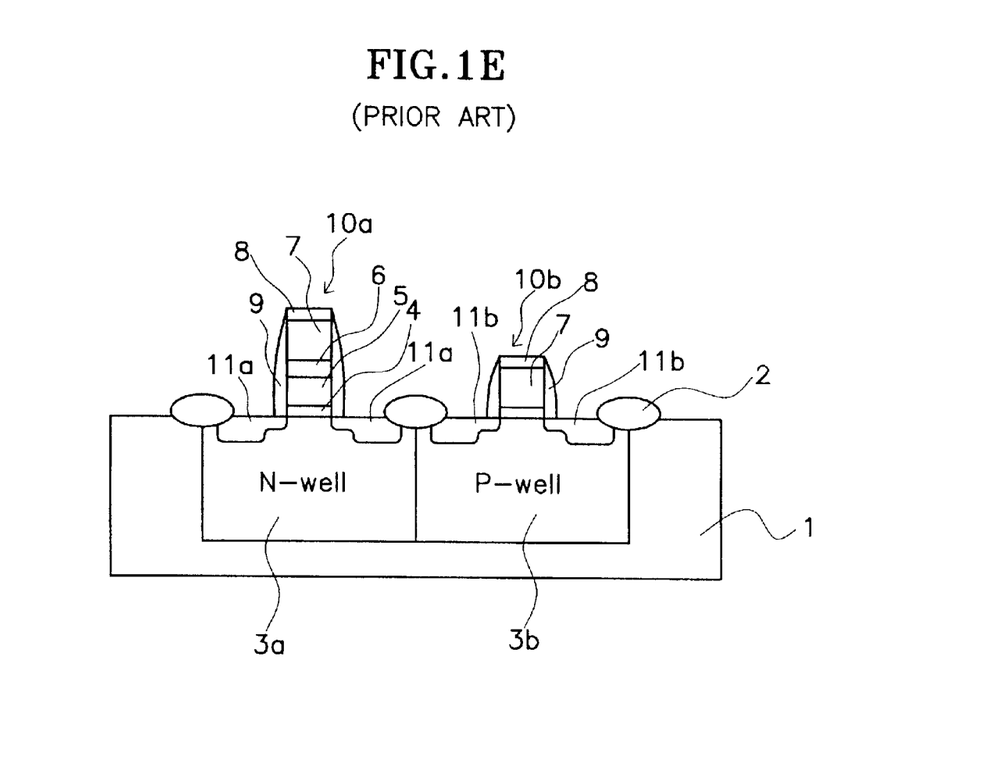

Referring to FIG. 1E, etched by the process known in the art are the mask nitride layer 8/NMOS metal layer 7/gate insulating layer 4 in the NMOS area and the mask layer 8/NMOS metal layer 7/barrier layer 6/PMOS metal layer 5/gate insulating layer 4 in the PMOS area. As a result of this etch, metal gates 10a and 10b are formed on the P well 3a and the N well 3b, respectively. A spacer nitride layer is deposited over an entire area of the semiconductor substrate 1. Spacers 9 are then formed on both sidewalls of the respective metal gates 10a and 10b by blanket-etching the nitride layer. Source/drain regions 11a and 11b are formed on later side of the respective metal gates 10a and 10b by carrying out source/drain ion implantation on the resulting structure having undergone the above steps. Consequently, a CMOS device including dual-metal gates is fabricated.

Unfortunately, the CMOS device including the dual-metal gates according to the related has problems or disadvantages, as follows.

First, when the dual-metal gates are formed by the prior art, the respective metal layers in the NMOS and PMOS areas are etched by RIE (reactive ion etch). Because the heights and materials of the respective metal gates in the NMOS and PMOS areas are different from each other, it is difficult to set up an etch recipe. Thus, if the recipe setup is wrong, poor etching may result in the NMOS area of which etch depth is relatively deep as well as substrate damage in the PMOS area of which etch depth is relatively shallow.

Second, when the dual-metal gate is formed by the prior art, plasma damages in the etching and ion implantation processes and thermal damage caused by a thermal process after the gate formation result, thereby reducing device characteristics.

Third, when the barrier layer and NMOS metal layer are etched in the PMOS area, the gate insulating layer in the PMOS area is damaged by the etch, thereby reducing GOI (gate oxide integrity) characteristics.

SUMMARY OF THE INVENTION

Accordingly, the present invention is directed to a method of forming dual-metal gates in a semiconductor device that substantially obviates one or more of the problems due to limitations and disadvantages of the prior art.

The object of the present invention is to provide a method of forming dual-metal gates in a semiconductor device enabling to overcome the difficulty in establishing an etch recipe.

Another object of the present invention is to provide a method of forming dual-metal gates in a semiconductor device so as to prevent plasma damage in the etching and ion implantation processes and thermal damage caused by a thermal process.

A further object of the present invention is to provide a method of forming dual-metal gates in a semiconductor device enabling prevention of GOI (gate oxide integrity) characteristic degradation.

Another further object of the present invention is to provide a method of forming dual-metal gates in a semiconductor device to overcome the above-mentioned problems or disadvantages using a damascene process.

Additional features and advantages of the invention will be set forth in the description which follows, and in part will be apparent from the description, or may be learned by practice of the invention. The objectives and other advantages of the invention will be realized and attained by the structure particularly pointed out in the written description and claims hereof, as well as the appended drawings.

To achieve these and other advantages, and in accordance with the purpose of the present invention as embodied and broadly described, a method of forming dual-metal gates according to the present invention includes the steps of providing a semiconductor substrate having a PMOS area and an NMOS area wherein dummy gates are formed in the PMOS and NMOS areas respectively, forming an insulating interlayer on the semiconductor substrate so as to cover the dummy gates, polishing the insulating interlayer until the dummy gates are exposed, forming a first groove defining a first metal gate area by selectively removing one of the dummy gates formed in the PMOS and NMOS areas, forming a first gate insulating layer and a first metal layer on an entire area of the semiconductor substrate including the first groove successively, forming a first metal gate in the first groove by etching the first metal layer and first gate insulating layer until the insulating interlayer is exposed, forming a second groove defining a second metal gate area by removing the remaining dummy gate, forming a second gate insulating layer and a second metal layer on the entire area of the semiconductor substrate including the second groove, and forming a second metal gate in the second groove by etching the second metal layer and second gate insulating layer until the insulating interlayer is exposed.

In another aspect of the present invention, a method of forming dual-metal gates includes the steps of providing a semiconductor substrate having a PMOS area and an NMOS area wherein dummy gates are formed in the PMOS and NMOS areas respectively, forming an insulating interlayer on the semiconductor substrate so as to cover the dummy gates, polishing the insulating interlayer until the dummy gates are exposed, forming first and second grooves defining first and second metal gate areas, respectively, by removing the dummy gates, successively forming a gate insulating layer and a first metal layer on an entire area of the semiconductor substrate including the first and second grooves, selectively forming a metal nitride layer by carrying out nitridation on the first metal layer formed in one of the PMOS and NMOS areas, forming a second metal layer on the metal nitride layer and the first metal layer so as to fill up the first and second grooves, and forming first and second metal gates in the PMOS and NMOS areas, respectively, by etching the second metal layer, first metal layer, metal nitride layer, and gate insulating layer until the insulating interlayer is exposed.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate embodiments of the invention and, together with the description, serve to explain the principles of the invention.

In the drawings.

DETAILED DESCRIPTION OF THE PREFERRED EMBODIMENTS

Reference will now be made in detail to the preferred embodiments of the present invention, examples of which are illustrated in the accompanying drawings. Where possible, the same reference numerals will be used to illustrate like elements throughout the specification.

The present invention is characterized in that dual-metal gates are formed using a damascene process. The damascene process has an advantage that all metals available for CMP (chemical mechanical polishing) are applied to gate materials. When dual-metal gates are formed using the damascene process, the difficulty in establishing the etch recipe is settled by skipping a step of etching a gate metal layer. Moreover, when dual-metal gates are formed using the damascene process, the plasma and thermal damages are applied to dummy polysilicon gates so as to prevent the degradation of the device caused by the damage.

FIGS. 2A to 2I illustrate cross-sectional views of forming dual-metal gates in a semiconductor device according to an embodiment of the present invention.

Figure 2A:
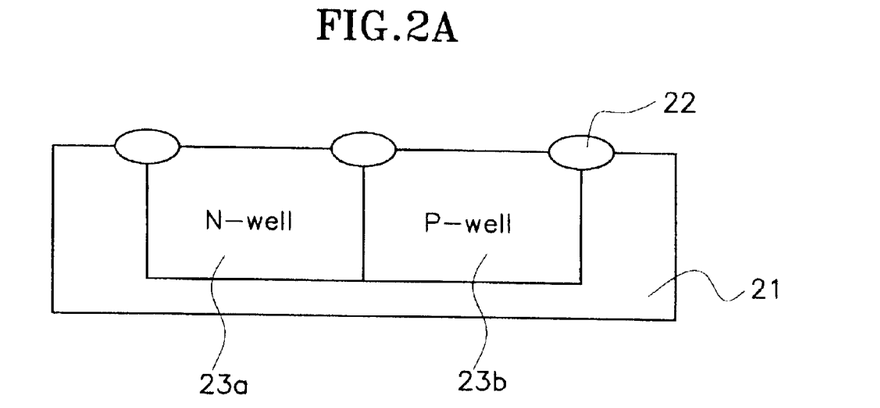
FIGS. 2A to 2I illustrate cross-sectional views of forming dual-metal gates in a semiconductor device according to an embodiment of the present invention.

Referring to FIG. 2A, a field oxide layer 22 is formed on a semiconductor substrate so as to define active areas. An N well (hereinafter called PMOS area) 23a and a P well (hereinafter called NMOS area) 23b are formed respectively in the active areas of the semiconductor substrate 21 by the masking and n and p type ion implantation processes known in the art.

Figure 2B:
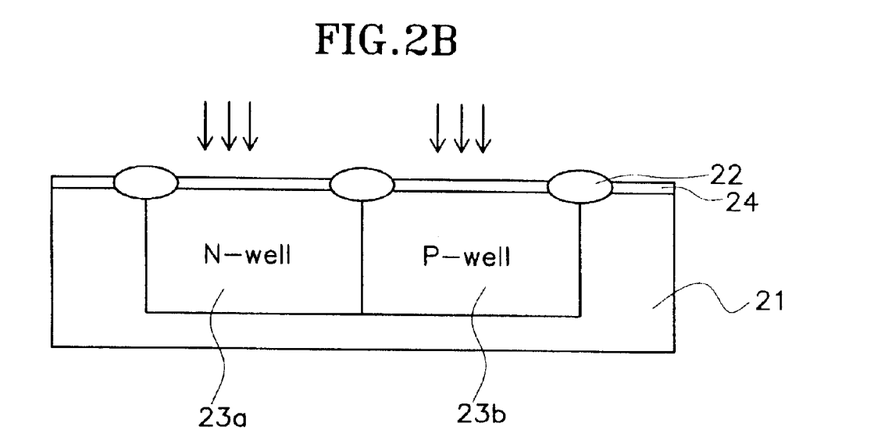

Referring to FIG. 2B, a screen oxide layer 24 is formed 50 to 100 Å thick on the semiconductor substrate 21 including the PMOS and NMOS areas 23a and 23b. Threshold voltage adjusting ion implantations are carried out on the PMOS area 23a and the NMOS area 23b, respectively, using a masking process known in the art. In this case, dopants for the ion implantations for the PMOS area 23a are As or P ions, while those for the NMOS area 23b are B or $BF_2$ ions.

Figure 2C:
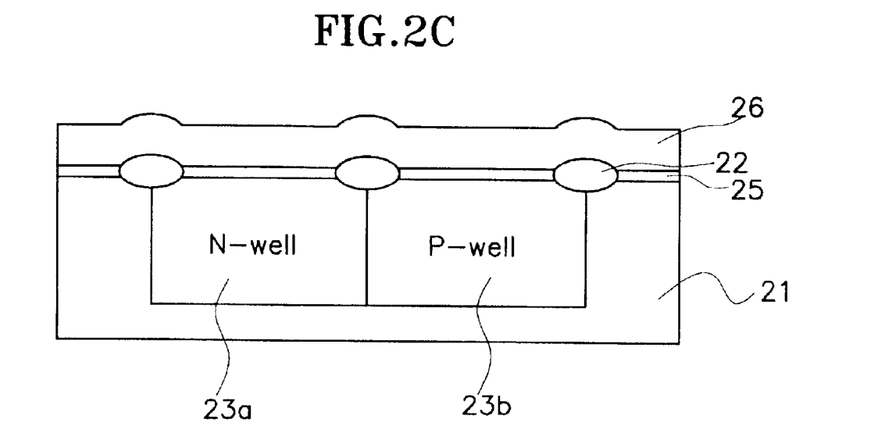

Referring to FIG. 2C, after the screen oxide layer 24 has been removed, a dummy gate oxide layer 25 is grown on a surface of the semiconductor substrate 21 including the PMOS and NMOS areas 23a and 23b. A doped dummy gate polysilicon layer 26 is then deposited 2000 to 4000 Å thick on the dummy gate insulating layer 25 by LPCVD (low pressure chemical vapor deposition). In this case, the doped dummy gate polysilicon layer 26 may be formed by dopant ion implantation or in-situ doping of dopant gas.

Figure 2D:
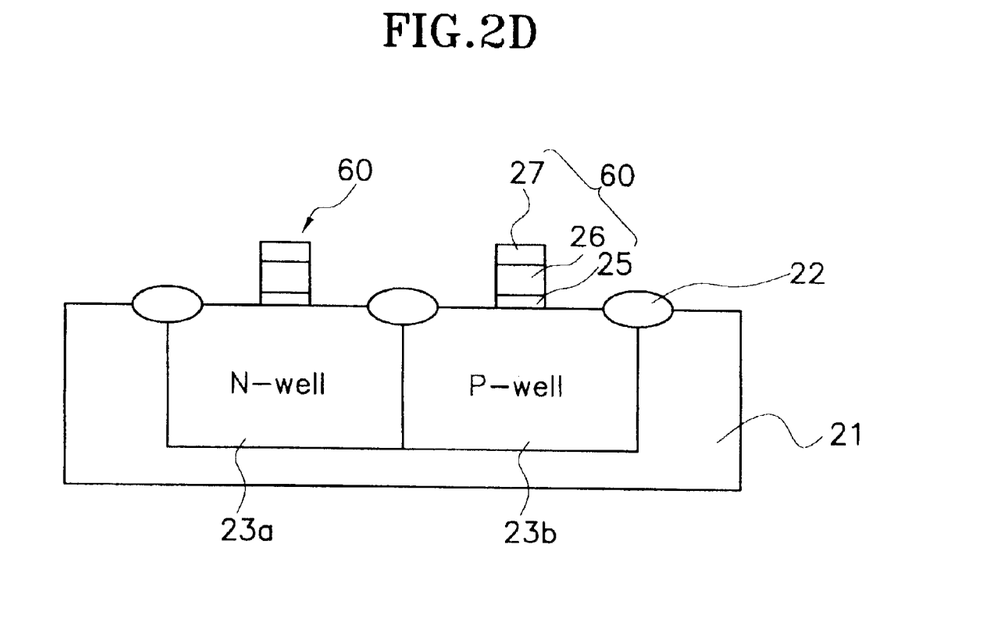

Referring to FIG. 2D, a mask nitride layer 27 is formed 800 to 1000 Å thick on the doped dummy gate polysilicon layer 26. The mask nitride layer 27, doped dummy gate polysilicon layer 26, and dummy gate insulating layer 25 are patterned by the photo/etch process known in the art, thereby forming dummy gates 60 in the PMOS and NMOS areas 23a and 23b of the semiconductor substrate 21, respectively.

Figure 2E:
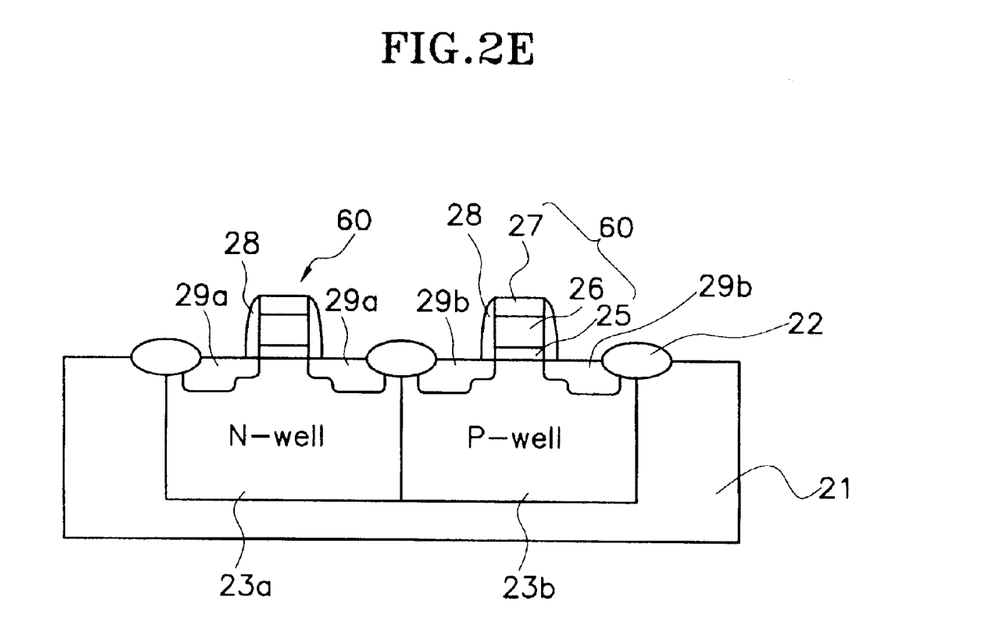

Referring to FIG. 2E, processes of implanting ions lightly, forming spacers 28, and implanting ions heavily are carried out on the resulted structure where the dummy gates 60 are formed respectively on the PMOS and NMOS areas 23a and 23b by the techniques known in the art. Therefore, LDD (lightly doped drain) source/drain regions 29a and 29b are formed respectively at both lateral sides of the dummy gates 60 in the PMOS and NMOS areas 23a and 23b.

In this case, the spacers 28 are formed at both sidewalls of the dummy gates by depositing a nitride layer 900 to 1200 Å thick and then carrying out blanket etch on the nitride layer. The PMOS area 23a may be formed using dopants such as As, P, or mixture of As and P, while the NMOS area 23b may be formed using dopants such as B, $BF_2$ or mixture of B and $BF_2$.

Figure 2F:
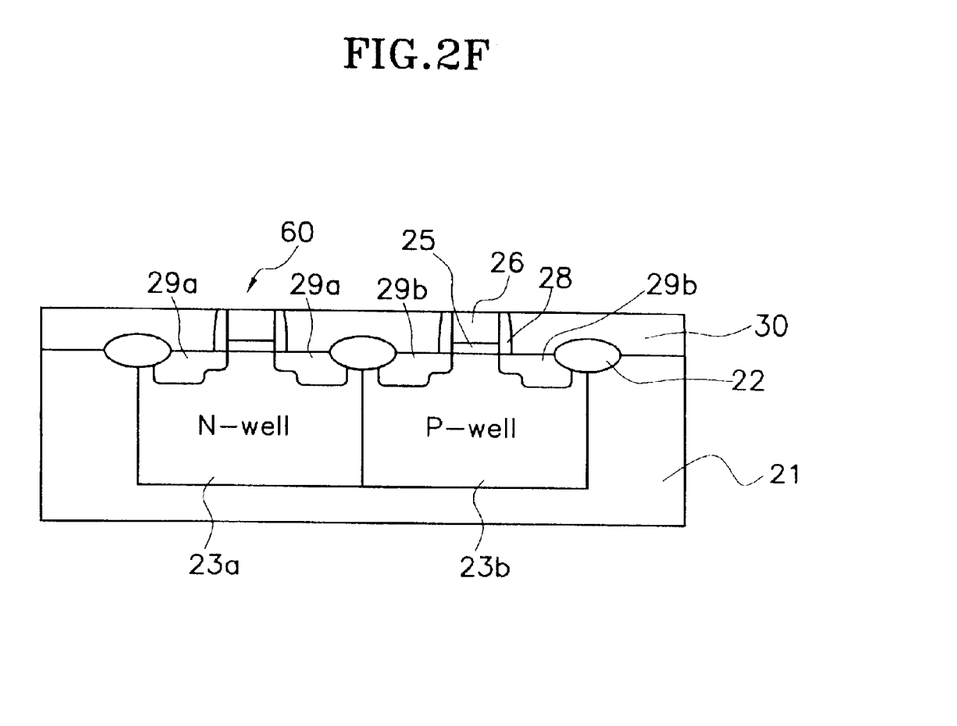

Referring to FIG. 2F, an insulating interlayer 30 is formed 5000 to 7000 Å thick over an entire surface of the semiconductor substrate 21 including the dummy gates 60. CMP is then carried out on the insulating interlayer 30 and mask nitride layer until the doped polysilicon layer 26 of the dummy gates 60 are exposed.

Figure 2G:
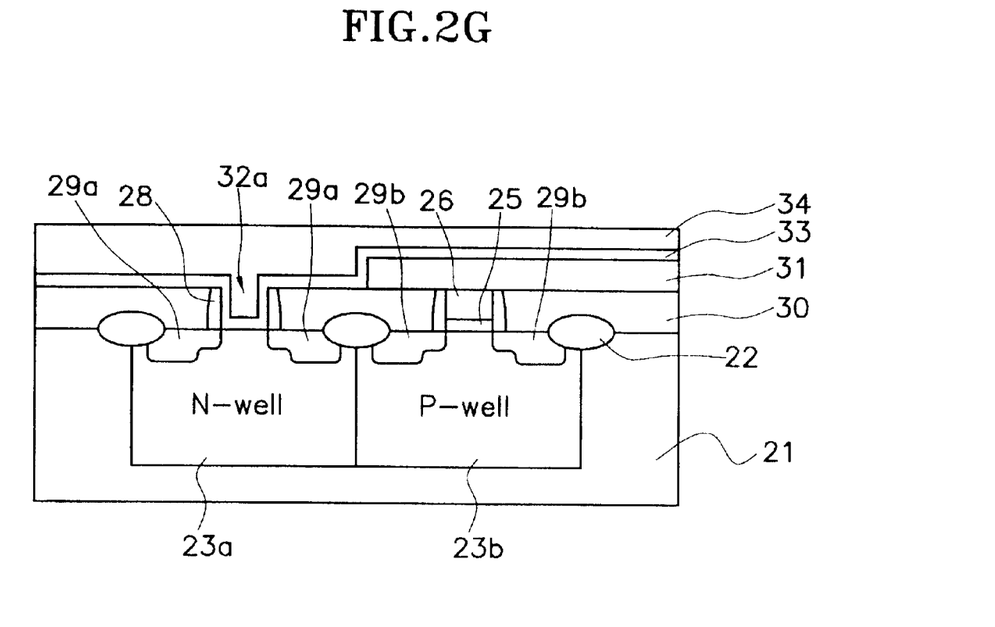

Referring to FIG. 2G, a mask oxide layer 31 is formed 500 to 800 Å thick on the insulating interlayer 30. The mask oxide layer 31 is then etched by a technique known in the art so as to cover the PMOS area 23a or NMOS area 23b only. In this case, it is preferable that the mask oxide layer is etched so as to cover the NMOS area 23b only. And, the doped polysilicon layer 26 of the dummy gate and the dummy gate insulating layer 25 underneath are removed by dry or wet etch, thereby a first groove 32a defining a PMOS metal gate area is formed. A first gate insulating layer 33 is formed on a surface of the first groove 32a, insulating interlayer 30, and the mask oxide layer 31. In this case, the first gate insulating layer 33 is formed of one of oxide, oxynitride, and high-k dielectric layers which are formed by deposition or growing. A first PMOS metal layer 34 is then formed on the first gate insulating layer 33 so as to fill up the first groove 32a.

Figure 2H:
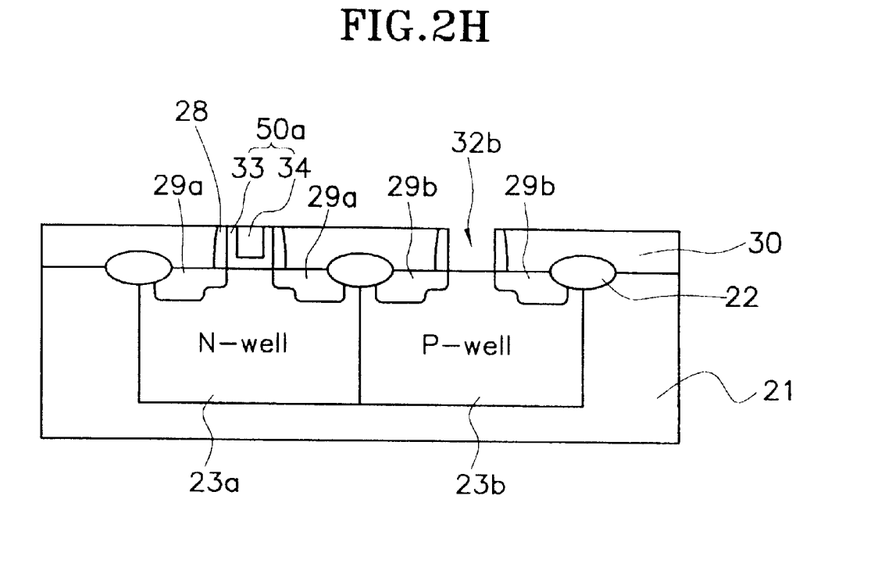

Referring to FIG. 2H, the first PMOS metal layer 34, first gate insulating layer 33, and mask oxide layer 31 are etch-backed or polished until the doped polysilicon layer of the NMOS area 23b is exposed, thereby a PMOS metal gate 50a is formed in the PMOS area 23a. The doped polysilicon layer and dummy gate insulating layer in the exposed NMOS area 23b are removed by dry or wet etch so as to form a second groove 32b defining a NMOS gate area.

Figure 2I:
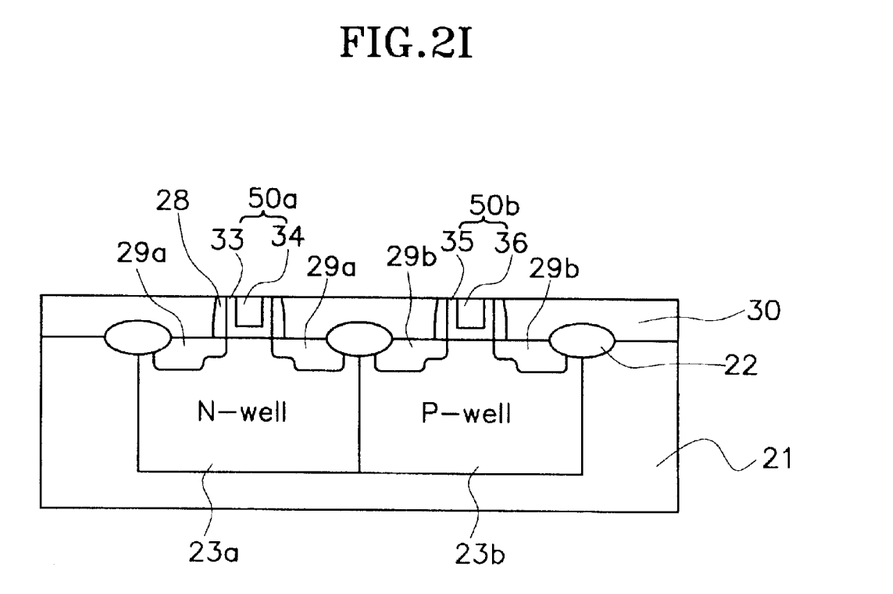

Referring to FIG. 2I, a second gate insulating layer 35 is formed on the insulating interlayer 30 and PMOS metal gate 50a including the second groove 32b. A second NMOS metal layer 36 is then formed on the second gate insulating layer 35 so as to fill up the second gate. An NMOS metal gate 50b is formed in the second groove by carrying out etch-back or polishing on the second NMOS metal layer 36 and second gate insulating layer 35 until the insulating interlayer 30 is exposed. Consequently, a CMOS device consisting of dual-metal gates having different metal gates 50a and 50b in the PMOS and NOS areas 23a and 23b respectively is completed.

As mentioned in the above description, the method according to the present invention includes a damascene process including the steps of defining gate areas and polishing gate metal layers. Accordingly, the present invention avoids the problem encountered in the prior art in establishing an etch recipe. Moreover, plasma and thermal damage results to the dummy gates, thereby preventing the degradation of metal gates due to such damage. Further, removal of dummy gates and formation of metal gates are carried out separately on PMOS and NMOS areas, thereby enabling fabrication of dual-metal gates having excellent profiles.

On the other hand, the above method of forming dual-metal gates according to the present invention is somewhat complicated since different metal gates are formed successively in the PMOS and NMOS areas, which makes setup for a fabrication process difficult and may increase the product cost.

Accordingly, the present invention discloses another method of forming dual-metal gates in a semiconductor device, so as to overcome the difficult setup for a fabrication process and the complicated process steps.

FIGS. 3A to 3D illustrate cross-sectional views of forming dual-metal gates in a semiconductor device according to another embodiment of the present invention, wherein the fabricating steps corresponding to the steps shown in FIG. 2A to FIG. 2F will be skipped in this description. Thus, the steps after them are explained in the following description for another embodiment of the present invention.

Figure 3A:
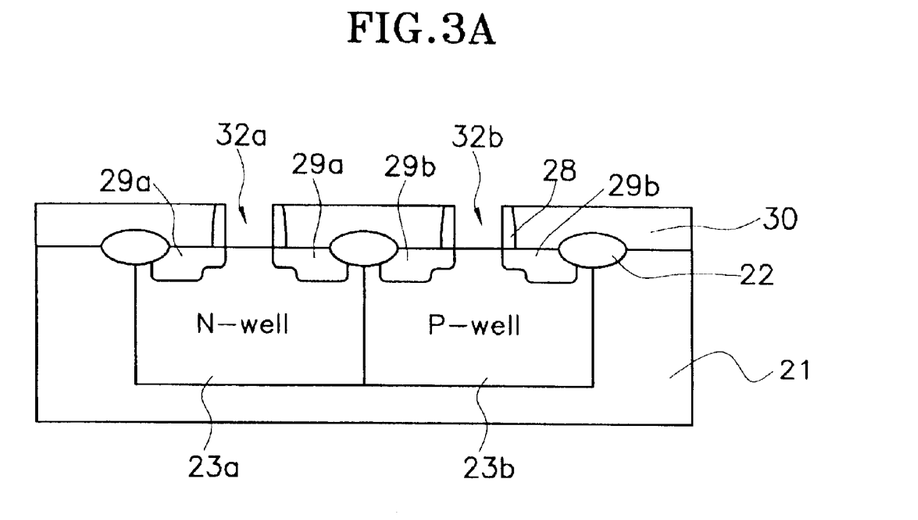
FIGS. 3A to 3D illustrate cross-sectional views of forming dual-metal gates in a semiconductor device according to another embodiment of the present invention.

Referring to FIG. 3A, the doped polysilicon layer and dummy gate insulating layer are removed by techniques known in the art such as dry etch or wet etch, whereby a first groove 32a defining a PMOS metal gate area and a second groove 32b defining an NMOS metal gate area are formed.

Figure 3B:
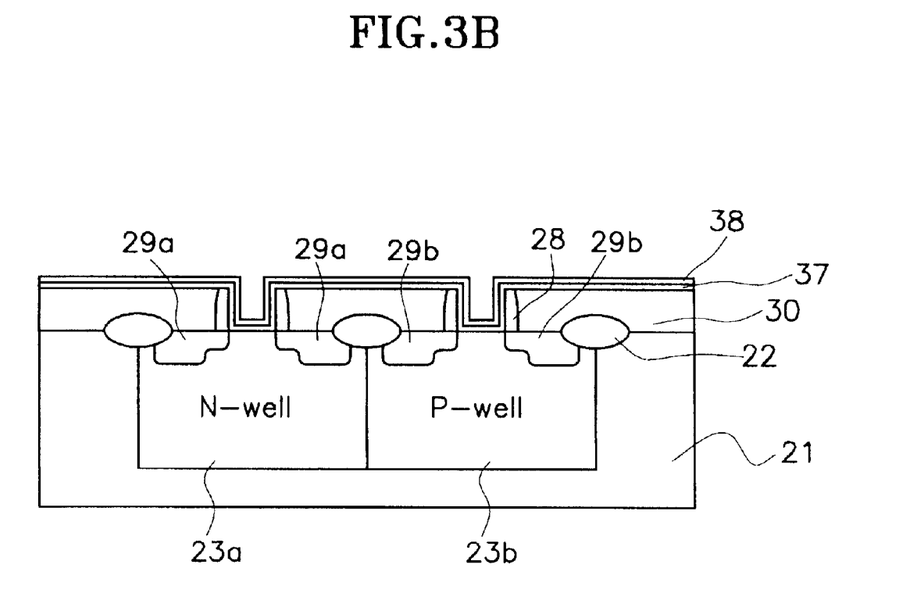

Referring to FIG. 3B, a gate insulating layer 37 and a first metal layer 38 are formed on surfaces of the first and second grooves 32a and 32b and the insulating interlayer 30, in order. In this case, the gate insulating layer 37 is formed one of oxide, oxynitride, high-k dielectric layers by growing or deposition. The first metal layer 38 is formed to adjust work function values of metal gates which will be formed in the PMOS and NOS areas 32a and 32b respectively. Thus, the first metal layer 38 is formed of one of W, Ti, Ta, Mo, and Al and formed 200 to 400 Å thick by CVD so as to secure an excellent step coverage characteristic.

Figure 3C:
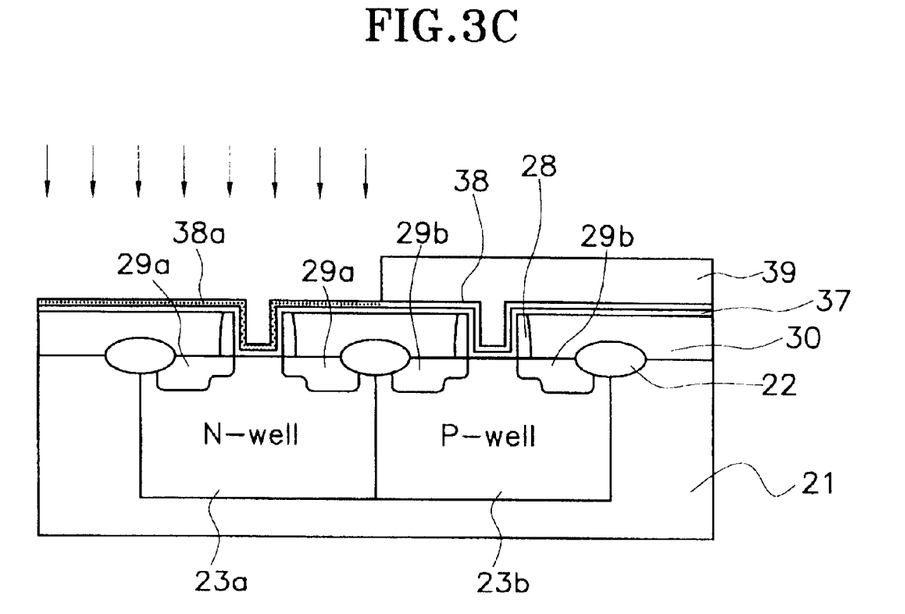

Referring to FIG. 3C, a mask pattern 39 is formed on one of the PMOS and NMOS areas 23a and 23b, more preferably, on the first metal layer formed in the NMOS area 23b. Nitridation is then carried out by nitrogen ion implantation or nitrogen plasma doping thereon, thereby a metal nitride layer 38a is formed on the first metal layer in the exposed PMOS area 23a. In this case, the metal nitride layer 38a is one of WN, TiN, TaN, MoN, and AlN.

In this case, nitridation using the nitrogen ion implantation is carried out using dopant of N or $N_2$ where N is ion-implanted at an energy of 0.5 to 5 KeV at a dose of $1 \times 10^{13}$ to $5 \times 10^{15}$ ions/cm$^2$ or N$_2$ is ion-implanted at an energy of 1 to 10 KeV at a dose of $1 \times 10^{13}$ to $5 \times 10^{15}$ ions/cm$^2$. The nitrogen plasma doping is carried out by applying negative voltage at the back side of the substrate when plasma is formed at a nitrogen ambience, where the applied voltage is between 0.2 and 5 KeV and the doping is carried out at a dose of $1 \times 10^{13}$ to $5 \times 10^{15}$ ions/cm$^2$. In this case, most nitrogen exists at a lower part of the first metal layer 38 in the nitrogen ion implantation, while most nitrogen exists at the lower and side parts of the first metal layer 38 owing to the conformal doping characteristic in the nitrogen plasma doping.

Figure 3D:
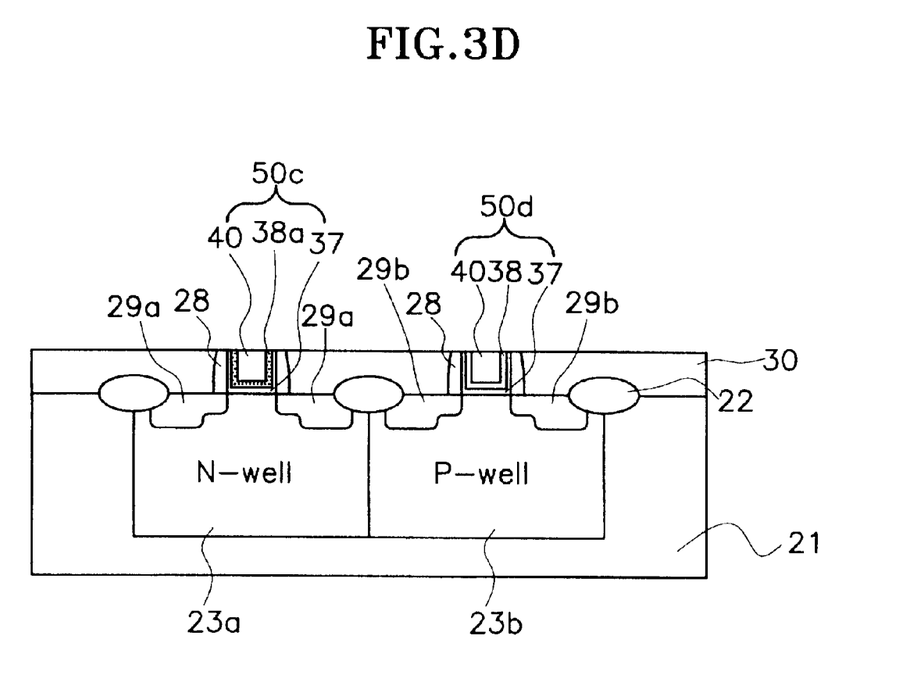

Referring to FIG. 3D, the mask pattern is removed. A second metal layer 40 having low resistance is then formed 3000 to 5000 Å thick by CVD on the metal nitride layer 38a in the PMOS area 23a and the first metal layer 38 in the NMOS area 23b so as to fill up the first and second grooves 32a and 32b. A PMOS gate 50C and an NMOS gate 50d are formed by carrying out etch-back or polishing on the second metal layer 40, first metal layer 38, metal nitride layer 38a, and gate insulating layer 37 until the insulating interlayer 30 is exposed. Consequently, a CMOS device consisting of dual-metal gates having metal gates 50c and 50d of the same material in the PMOS and NMOS areas 23a and 23b is fabricated.

In the above explanation, the first metal layer 38 may be formed with a metal nitride layer, which is possible for the following reason. Namely, the work function value of the metal nitride layer is changed in accordance with the variable nitrogen component ratio in the metal nitride layer due to the succeeding nitridation. Therefore, the capability exists to establish a pair of metal nitride layers satisfying the optimal condition as dual-metal gates.

The method of forming dual-metal gates according to the latter embodiment of the present invention uses the damascene process as used in the former embodiment of the present invention, thereby basically overcoming the difficulty in establishing an etch recipe and the problems caused by plasma and thermal damage. Moreover, this method, compared to the former method, enables solution of the problems of complicated process steps and the product cost increase by just adding nitridation thereto.

Accordingly, the present invention provides for prevention of the defect generation from process and the device characteristic degradation using a damascene process. Thus, the methods according to the present invention provide the base enabling to overcome the problems of the process and device characteristics in the prior art. Therefore, the present invention enables fabrication of a highly integrated semiconductor device stably.

The foregoing embodiments are merely exemplary and are not to be construed as limiting the present invention. The present teachings can be readily applied to other types of apparatus. The description of the present invention is intended to be illustrative, and not to limit the scope of the claims. Many alternatives, modifications, and variations will be apparent to those skilled in the art.

What is claimed is:

1. A method of forming dual-metal gates comprising the steps of:
    providing a semiconductor substrate having a PMOS area and an NMOS area wherein dummy gates are formed in the PMOS and NMOS areas respectively;
    forming an insulating interlayer on the semiconductor substrate so as to cover the dummy gates;
    polishing the insulating interlayer until the dummy gates are exposed;
    forming a first groove defining a first metal gate area by selectively removing one of the dummy gates formed in the PMOS and NMOS areas;
    forming a first gate insulating layer and a first metal layer on an entire area of the semiconductor substrate including the first groove successively;
    forming a first metal gate in the first groove by etching the first metal layer and first gate insulating layer until the insulating interlayer is exposed;
    forming a second groove defining a second metal gate area by removing the remaining dummy gate;
    forming a second gate insulating layer and a second metal layer on the entire area of the semiconductor substrate including the second groove; and
    forming a second metal gate in the second groove by etching the second metal layer and second gate insulating layer until the insulating interlayer is exposed.

2. The method of claim 1, wherein the dummy gates are formed of stacked layers comprising oxide and doped polysilicon layers.

3. The method of claim 2, wherein the doped polysilicon layer is formed 2000 to 4000 Å thick by LPCVD (low pressure chemical vapor deposition).

4. The method of claim 2, wherein the doped polysilicon layer is formed by dopant ion implantation or in-situ doping of dopant gas.

5. The method of claim 1, further comprising between the steps of forming the dummy gates and forming the insulating interlayer the following steps:
    masking and lightly-doping ion implantation processes on the PMOS and NMOS areas in order;
    depositing a nitride layer 900 to 1200 Å thick on the semiconductor substrate including on the dummy gates;
    forming spacers at both sidewalls of the dummy gates by blanket-etching the nitride layer; and
    forming source/drain regions having lightly doped drain regions in the PMOS and NMOS areas below both lateral side extensions of the dummy gates including the spacers by carrying out masking and heavily-doping ion implantation processes on the PMOS and NMOS areas successively.

6. The method of claim 1, wherein the insulating interlayer is formed 5000 to 7000 Å thick.

7. The method of claim 1, wherein the dummy gates are removed by dry etch or wet etch using mask oxide layers as etch barriers.

8. The method of claim 7, wherein the mask oxide layers are formed 500 to 800 Å thick.

9. The method of claim 1, wherein the first and second gate insulating layers are formed by sequential deposition of an oxide layer, an oxynitride layer, and a high-k dielectric layer.

10. The method of claim 1, wherein the steps of etching the first and second metal layers and the first and second gate insulating layers are carried out by CMP (chemical mechanical polishing) or etch-back.

11. A method of forming dual-metal gates comprising the steps of:
    providing a semiconductor substrate having a PMOS area and an NMOS area wherein dummy gates are formed in the PMOS and NMOS areas, respectively;
    forming an insulating interlayer on the semiconductor substrate so as to cover the dummy gates;
    polishing the insulating interlayer until the dummy gates are exposed;

forming first and second grooves defining first and second metal gate areas, respectively, by removing the dummy gates;

successively forming a gate insulating layer and a first metal layer on an entire area of the semiconductor substrate including on the first and second grooves;

selectively forming a metal nitride layer by carrying out nitridation on the first metal layer formed in one of the PMOS and NMOS areas;

forming a second metal layer on the metal nitride layer and the first metal layer so as to fill up the first and second grooves; and forming first and second metal gates in the PMOS and NMOS areas, respectively, by etching the second metal layer, first metal layer, metal nitride layer, and gate insulating layer until the insulating interlayer is exposed.

12. The method of claim 11, wherein the gate insulating layer is formed by sequential deposition of an oxide layer, an oxynitride layer, and a high-k dielectric layer.

13. The method of claim 11, wherein the first metal layer is selectively formed of one of W, Ti, Ta, Mo, and Al.

14. The method of claim 13, wherein the first metal layer is formed 200 to 400 Å thick by CVD.

15. The method of claim 11, wherein the nitridation is carried out by nitrogen ion implantation or by nitrogen plasma doping.

16. The method of claim 15, wherein the nitrogen ion implantation is carried out using N or $N_2$ as a dopant.

17. The method of claim 16, wherein the dopant of N is ion-implanted at an energy of 0.5 to 5 KeV and at a dose of $1 \times 10^{13}$ to $5 \times 10^{15}$ ions/cm$^2$.

18. The method of claim 16, wherein the dopant of $N_2$ is ion-implanted at an energy of 1 to 10 KeV and at a dose of $1 \times 10^{13}$ to $5 \times 10^{15}$ ions/cm$^2$.

19. The method of claim 15, wherein the nitrogen plasma doping is carried in ambient nitrogen, at an energy of 0.2 to 5 KeV, and at a dose of $1 \times 10^{13}$ to $5 \times 10^{15}$ ions/cm$^2$.

20. The method of claim 11, wherein the second metal layer is formed of a low-resistance metal layer 2000 to 5000 Å thick.

* * * * *